(12) United States Patent
Nangoy et al.

(10) Patent No.: US 11,251,047 B2
(45) Date of Patent: Feb. 15, 2022

(54) CLOG DETECTION IN A MULTI-PORT FLUID DELIVERY SYSTEM

(71) Applicant: Applied Materials, Inc., Santa Clara, CA (US)

(72) Inventors: Roy C. Nangoy, Santa Clara, CA (US); Chad Pollard, San Jose, CA (US); Allen L. D'Ambra, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 78 days.

(21) Appl. No.: 16/173,676

(22) Filed: Oct. 29, 2018

(65) Prior Publication Data

US 2019/0148160 A1    May 16, 2019

Related U.S. Application Data

(60) Provisional application No. 62/630,654, filed on Feb. 14, 2018, provisional application No. 62/585,364, filed on Nov. 13, 2017.

(51) Int. Cl.
*H01L 21/306*    (2006.01)
*B24B 57/02*    (2006.01)
*B67D 7/12*    (2010.01)
*B67D 7/42*    (2010.01)
*G01F 1/20*    (2006.01)

(52) U.S. Cl.
CPC ........ *H01L 21/30625* (2013.01); *B24B 57/02* (2013.01); *B67D 7/12* (2013.01); *B67D 7/42* (2013.01); *G01F 1/206* (2013.01)

(58) Field of Classification Search
None
See application file for complete search history.

(56) References Cited

U.S. PATENT DOCUMENTS

| | | |
|---|---|---|
| 5,693,887 A | 12/1997 | Englund et al. |
| 6,183,341 B1 | 2/2001 | Melcer |
| 6,855,031 B2 | 2/2005 | Fuksshimov et al. |

(Continued)

FOREIGN PATENT DOCUMENTS

| | | |
|---|---|---|
| CN | 1537037 A | 10/2004 |
| CN | 1639453 A | 7/2005 |

(Continued)

OTHER PUBLICATIONS

PCT International Search Report and Written Opinion dated Feb. 13, 2019, for International Application No. PCT/US2018/058202.

(Continued)

*Primary Examiner* — Sylvia MacArthur
(74) *Attorney, Agent, or Firm* — Patterson + Sheridan, LLP (57) ABSTRACT

Embodiments of the present disclosure provide for apparatus used to detect clogs in a fluid delivery system during CMP processes and methods of detecting clogs in a fluid delivery system during CMP processes. In particular, embodiments herein provide a flow splitter manifold configured to enable monitoring of the pressure of the polishing fluid disposed therein. Monitoring the fluid pressure in the flow splitter manifold enables the detection of clogs in the delivery lines and/or dispense nozzles that inhibit and/or prevent the flow of polishing fluid therethrough or therefrom.

22 Claims, 6 Drawing Sheets

(56) References Cited

U.S. PATENT DOCUMENTS

| | | | | |
|---|---|---|---|---|
| 6,939,210 B2* | 9/2005 | Polyak | .................... | B24B 37/04 451/36 |
| 7,086,933 B2 | 8/2006 | Vereen et al. | | |
| 8,372,209 B2* | 2/2013 | Enicks | ................. | B08B 7/0071 134/21 |
| 8,414,357 B2* | 4/2013 | Wang | ...................... | B24B 37/04 451/41 |
| 8,523,639 B2* | 9/2013 | Leighton | ................ | B24B 37/04 451/446 |
| 9,776,216 B2 | 10/2017 | Yu et al. | | |
| 2004/0060607 A1 | 4/2004 | Wheeler | | |
| 2004/0108062 A1* | 6/2004 | Moore | .................... | B24B 37/30 156/345.11 |
| 2005/0211802 A1 | 9/2005 | Newton | | |
| 2008/0076332 A1 | 3/2008 | Serafin et al. | | |
| 2009/0025472 A1 | 1/2009 | Garvin | | |
| 2010/0084023 A1 | 4/2010 | Melcer et al. | | |
| 2015/0240359 A1 | 8/2015 | Jdira et al. | | |
| 2017/0092519 A1* | 3/2017 | Sakugawa | ............... | B24B 37/30 |
| 2019/0148160 A1* | 5/2019 | Nangoy | ................... | B67D 7/12 438/692 |

FOREIGN PATENT DOCUMENTS

| | | |
|---|---|---|
| CN | 1703774 A | 11/2005 |
| CN | 101031715 A | 9/2007 |
| CN | 101808826 A | 8/2010 |
| CN | 206292039 U | 6/2017 |
| JP | 2010112923 A | 5/2010 |
| KR | 20150100536 A | 9/2015 |
| KR | 20150104790 A | 9/2015 |
| KR | 101584943 B1 | 1/2016 |
| TW | 201602393 A | 1/2016 |
| WO | 2003011523 A1 | 2/2003 |

OTHER PUBLICATIONS

Reddy, R, List of Pressure Measuring Devices, Fluid Mechanics, https://www.engineeringenotes.com/fluids/measurement-of-pressure/list-of-pressure-measuring-devices-fluid-mechanics/46972 (last visited Jan. 21, 2021), 13 pages.

Measure and Pressure Control Devices, https://engineeringlibrary.org/reference/hydraulic-measurement-and-pressure-control-devices-navy (last visited Jan. 21, 2021), 19 pages.

Pressure Measurement, https://www.transcat.com/products/pressure-measurement (last visited Jan. 21, 2021), 2 pages.

Pressure Measuring Devices with Bourdon Tube, Diaphragm or Capsule Element, https://www.wika.us/andingpage_pressure_measuring_device_en_us.WIKA (last visited Jan. 21, 2021), 8 pages.

Supplementary European Search Report for Application No. EP 18 87 6326, dated Jul. 16, 2021.

Office Action for Chinese Application No. 2018800717557 dated Oct. 11, 2021.

Search Report for Chinese Application No. 2018800717557 dated Sep. 29, 2021.

* cited by examiner

310 — FLOWING A POLISHING FLUID TO AN INLET PORT OF A FLOW SPLITTER MANIFOLD, THE FLOW SPLITTER MANIFOLD COMPRISING:

A MANIFOLD BODY HAVING AN INLET PORT AND A PLURALITY OF OUTLET PORTS IN FLUID COMMUNICATION WITH THE INLET PORT THROUGH A PLURALITY OF DELIVERY CONDUITS FORMED IN THE MANIFOLD BODY;

A PLURALITY OF OUTLET FITTINGS RESPECTIVELY DISPOSED IN EACH OF THE PLURALITY OF OUTLET PORTS;

A PLURALITY OF DELIVERY LINES EACH FLUIDLY COUPLED TO A RESPECTIVE OUTLET PORT BY ONE OF THE PLURALITY OF OUTLET FITTINGS; AND

A PRESSURE MEASURING DEVICE FLUIDLY COUPLED TO A PRESSURE MEASURING PORT, WHEREIN THE PRESSURE MEASURING PORT IS IN FLUID COMMUNICATION WITH ONE OR MORE OF THE PLURALITY OF DELIVERY CONDUITS;

320 — MEASURING A PRESSURE OF THE POLISHING FLUID DISPOSED IN THE MANIFOLD BODY; AND

330 — DISPENSING THE POLISHING FLUID ONTO A SURFACE OF A POLISHING PAD THROUGH A PLURALITY OF DISPENSE NOZZLES, WHEREIN EACH OF THE PLURALITY OF DISPENSE NOZZLES ARE FLUIDLY COUPLED TO A RESPECTIVE DELIVERY LINE OF THE PLURALITY OF DELIVERY LINES.

CLOG DETECTION IN A MULTI-PORT FLUID DELIVERY SYSTEM

CROSS-REFERENCE TO RELATED APPLICATIONS

This application claims benefit of U.S. Provisional Application Ser. No. 62/585,364 filed on Nov. 13, 2017 and of U.S. Provisional Application Ser. No. 62/630,654 filed on Feb. 14, 2018 both of which are herein incorporated by reference in their entireties.

BACKGROUND

Field

Embodiments described herein generally relate to apparatus and methods used in semiconductor device manufacturing, and more particularly, to apparatus and methods used for the delivery of fluids during chemical mechanical planarization (CMP) of a substrate in an electronic device fabrication process.

Description of the Related Art

Chemical mechanical polishing (CMP) is commonly used in the manufacture of high-density integrated circuits to planarize or polish a layer of material deposited on a substrate, by contacting the material layer to be planarized with a polishing pad mounted on a polishing platen, and moving one or both of the polishing pad and the substrate (and thus the material layer surface on the substrate) with respect to each other in the presence of a polishing fluid.

Polishing fluid delivery systems are commonly used in CMP processes to deliver the polishing fluid to the surface of the polishing pad and thus deliver the polishing fluid to an interface between the polishing pad and the material layer surface on the substrate. Typically, the polishing fluid comprises abrasive particles suspended in a suspension fluid and/or reactive agent (i.e. a slurry) where the abrasive particles provide at least a mechanical action against the material layer surface of the substrate to desirably remove material therefrom. Often, delivery lines in the fluid delivery systems become undesirably restricted, and in some cases fully obstructed, by condensed and dried slurry disposed therein, resulting in partial or full obstructions in the polishing fluid delivery lines, inconsistent polishing results, and frequent system maintenance requirements.

Accordingly, there is a need in the art for apparatus and methods to detect obstructions and restrictions in CMP fluid delivery systems.

SUMMARY

Embodiments of the present disclosure provide for apparatus for detecting the presence of obstruction(s) and restriction(s) in a fluid delivery system used in chemical mechanical polishing (CMP) apparatus and processes and methods of detecting obstruction(s) and restriction(s) in such a fluid delivery system during chemical mechanical polishing (CMP) processes.

In one embodiment, a fluid delivery apparatus includes a unitary manifold body having an inlet port, a plurality of outlet ports in fluid communication with the inlet port, and a pressure measuring port formed in the unitary manifold body and in fluid communication with at least one of the inlet ports. Herein, the inlet port is in fluid communication with the plurality of outlet ports through a corresponding plurality of fluid delivery conduits extending in or through the unitary manifold body.

In another embodiment, a fluid delivery apparatus includes a flow splitter manifold having an inlet port and a plurality of outlet ports in fluid communication with the inlet port through a corresponding plurality of fluid delivery conduits. The plurality of fluid delivery conduits include a first conduit and a plurality of second conduits fluidly coupled to the first conduit. The fluid delivery apparatus further includes a pressure measuring port in fluid communication with each of the plurality of second conduits and a plurality of outlet fittings respectively disposed in each of the plurality of outlet ports. Each of the plurality of fittings is configured to fluidly couple a respective second conduit to a delivery line. The fluid delivery apparatus further includes a pressure measuring device fluidly coupled to the pressure measuring port.

In another embodiment, a method of detecting obstruction(s) in a multi-dispense nozzle fluid delivery system used in a chemical mechanical polishing (CMP) system is provided. The method includes flowing a polishing fluid to an inlet port of a flow splitter manifold, measuring a pressure of the polishing fluid disposed in a manifold body of the flow splitter manifold, and dispensing the polishing fluid onto a surface of a polishing pad through a plurality of dispense nozzles. The flow splitter manifold includes the manifold body having an inlet port and a plurality of outlet ports in fluid communication with the inlet port through a plurality of fluid delivery conduits formed in the manifold body, a plurality of outlet fittings respectively disposed in each of the plurality of outlet ports, and a plurality of delivery lines each fluidly coupled to a respective outlet port by one of the plurality of outlet fittings. The flow splitter manifold further includes a pressure measuring device fluidly coupled to a pressure measuring port, wherein the pressure measuring port is in fluid communication with one or more of the plurality of delivery conduits, and wherein the plurality of dispense nozzles are each fluidly coupled to a respective delivery line of the plurality of delivery lines.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure provide for apparatus for detecting obstruction(s) in a fluid delivery system during chemical mechanical polishing (CMP) processes and methods of detecting obstruction(s) and restrictions in such a fluid delivery system during CMP processes. During a conventional CMP process, polishing fluids are dispensed to a location near the center of the polishing pad through a fluid dispense arm positioned thereover. The dispensed polishing fluid is distributed radially outwardly from the dispensed location by the centrifugal force imparted thereto by the rotating polishing pad and along grooves and/or channels formed in the polishing pad. Multi-port dispense arms and/or multi-dispense nozzle distribution systems enable reduced polishing fluid consumption during CMP, when compared to a conventional CMP process, by spacing a plurality of dispense openings and/or dispense nozzles across a radius of the polishing pad and uniformly dispensing the polishing fluid therefrom. In a conventional fluid delivery system, the flowrate of fluid flowing to a single dispense opening/nozzle is typically monitored using a flowmeter and/or flow controller positioned in and/or on a delivery line leading thereto. Obstruction(s) and restrictions in a conventional fluid delivery system are detected by disruptions in the rate of fluid flow to the single monitored dispense opening/nozzle. In a multi-dispense nozzle distribution system measuring and/or monitoring the flowrate in individual delivery lines is costly, impracticable, and in some circumstances disrupts the flow of the polishing fluid flowing therethrough. Therefore, embodiments herein provide a flow splitter manifold, and a pressure measuring device coupled thereto, that enables measuring and monitoring of the pressure of the polishing fluid in the flow splitter manifold. Monitoring the fluid pressure in the flow splitter manifold enables the detection of the presence of an obstruction or restriction in one or more of the delivery lines and dispense nozzles that inhibit or prevent the flow of polishing fluid therethrough or therefrom.

Figure 1A:
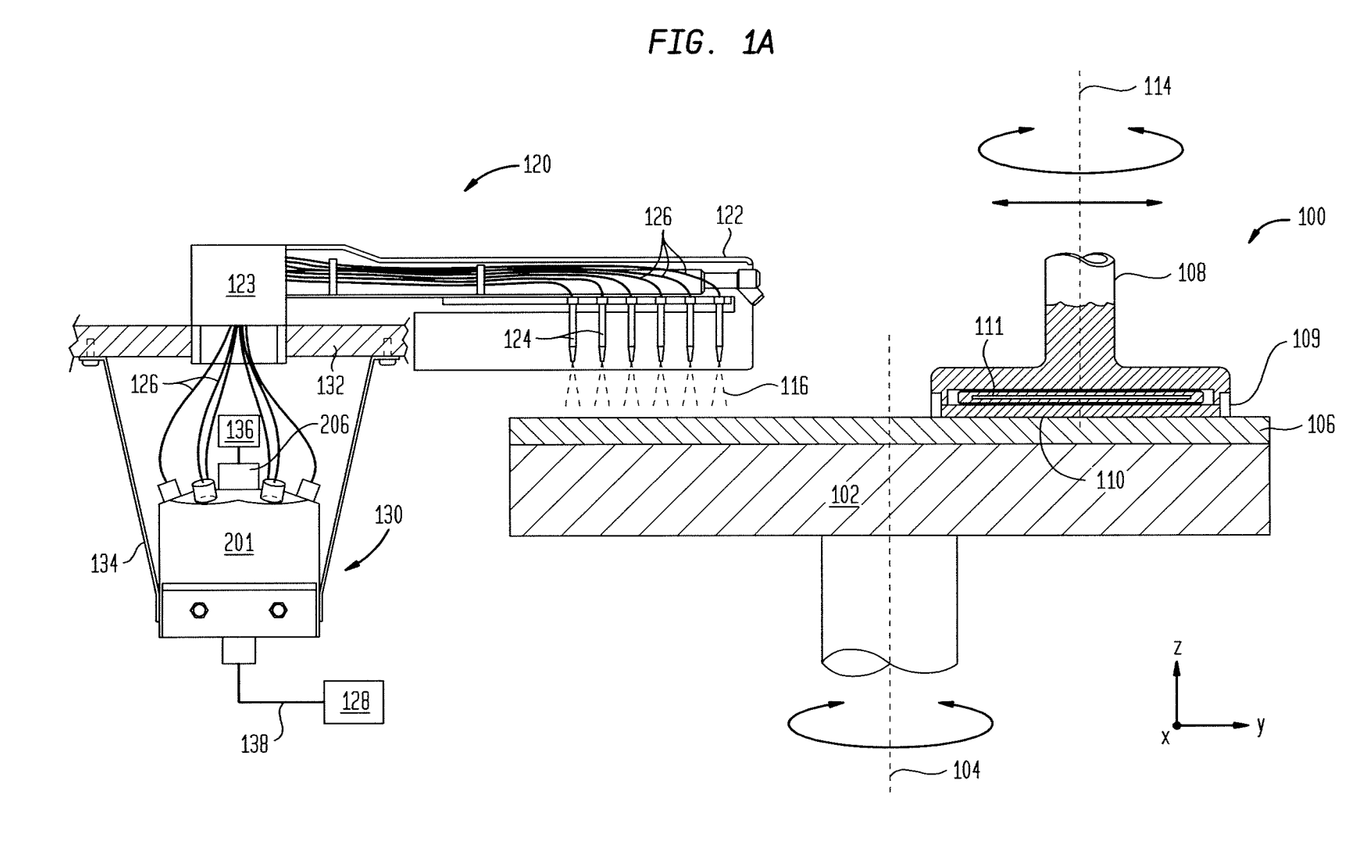
FIG. 1A is a schematic sectional view of a polishing system using a multi-dispense nozzle fluid delivery system, according to embodiments described herein.

FIG. 1 is a schematic sectional view of an example polishing system using a multi-dispense nozzle fluid delivery system according to embodiments described herein. The polishing system 100 typically includes a polishing platen 102 rotatably disposed about a platen axis 104, a polishing pad 106 mounted on the upper surface of the polishing platen 102, a substrate carrier 108 rotatably disposed about a carrier axis 114 and having a substrate holding surface facing the polishing platen 102, a polishing fluid delivery system, such as the multiport polishing fluid delivery system 120 described herein, disposed on a base plate 132, and a polishing pad conditioning apparatus (not shown). Herein, the substrate carrier 108 includes a flexible diaphragm 111 configured to impose different pressures against different regions of a substrate 110 on the substrate holding surface thereof while urging the to be polished surface of the substrate 110 against the polishing surface of the polishing pad 106, and a carrier ring 109 surrounding the substrate 110.

During polishing, a downforce on the carrier ring 109 urges the carrier ring 109 against the polishing pad 106 which prevents the substrate 110 from slipping from the substrate carrier 108 during the polishing process and deforms the pad to reduce or eliminate polishing edge effects on the substrate edge. The substrate carrier 108 rotates about the carrier axis 114 while the flexible diaphragm 111 urges the to be polished surface of the substrate 110 against the polishing surface of the polishing pad 106. The platen 102 rotates about the platen axis 104 in an opposite rotational direction from the rotation direction of the substrate carrier 108. Concurrently, the substrate carrier 108 sweeps back and forth from an inner diameter of the platen 102 to an outer diameter of the platen 102 to, in part, reduce uneven wear of the polishing pad 106.

During polishing, one or more polishing fluids 116 are introduced to the polishing pad 106 using fluid delivery system 120. The fluid delivery system 120 herein is a multi-dispense nozzle fluid delivery system and includes a delivery arm 122 coupled to an actuator 123 that positions the delivery arm 122 above the polishing pad 106 by swinging the delivery arm 122 thereover and/or lowering the delivery arm 122 theretowards. The fluid delivery system 120 further includes a plurality of dispense nozzles 124 disposed on and/or in the delivery arm 122, and a plurality of delivery lines 126 fluidly coupling the dispense nozzles to a flow splitter manifold 130. Typically, the plurality of dispense nozzles 124 includes between about 2 and 20 dispense nozzles, such as between 2 and 15 dispense nozzles, for example between about 2 and 10 dispense nozzles. Herein, the flow splitter manifold 130 is fluidly coupled to a polishing fluid supply 128 and is also secured to a base plate 132 by a support bracket 134. In embodiments herein, the flow splitter manifold 130 is disposed below a horizontal plane of the delivery arm 122 so that the dispense nozzles 124 are disposed above the flow splitter manifold 130 to prevent syphoning of polishing fluid therefrom and to ensure that polishing fluid does not undesirably drain from the flow splitter manifold 130 during periods of non-use. Draining of polishing fluid 116 from the flow splitter manifold 130 undesirably contributes to agglomeration of abrasive particles commonly found in polishing fluids by the drying thereof, the coagulation of the polishing fluid by exposure thereof to the oxygen containing atmosphere, and/or condensation of the polishing fluid on the inner surfaces of the fluid delivery system 120.

Figure 1B:
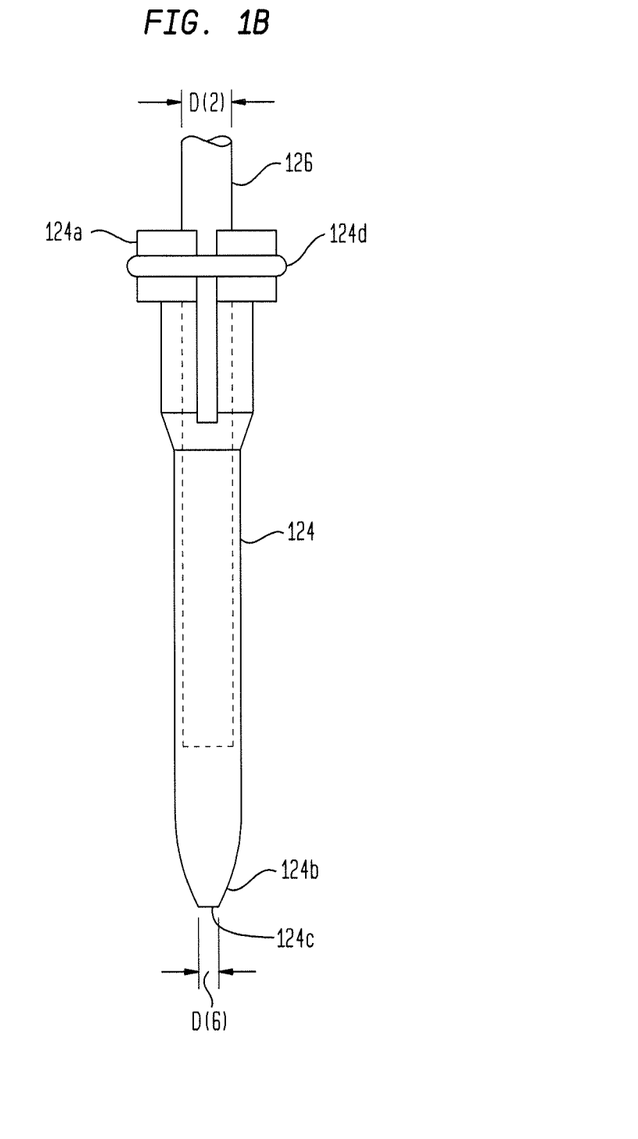
FIG. 1B is a schematic view of a dispense nozzle used in the fluid delivery system shown in FIG. 1A, according to embodiments described herein.

FIG. 1B is a close up schematic view of one of the plurality of dispense nozzles 124 shown in FIG. 1A. The dispense nozzle 124 is configured for quick change out thereof during routine maintenance and/or after an obstruction or restriction is detected therein. Herein, the dispense nozzle 124 comprises an elongated body having a first end 124a for receiving one of the plurality of delivery lines 126 and a second end 124b for dispensing the polishing fluid 116 onto the polishing pad 106. The dispense nozzle 124 is secured to an end of the delivery line 126 by an O-ring 124d disposed about the first end 124a thereof and interferingly received within a corresponding opening in the delivery arm 122. Herein, the plurality of dispense nozzles 124 and the plurality of delivery lines 126 are formed of one or more fluorine-containing polymers (flouropolymers), such as perfluoroalkoxy (PFA), fluorinated ethylene propylene (FEP), or polytetrafluoroethylene (PTFE) commercially available as TEFLON® from DuPont Co., or combinations thereof.

During CMP processes, the polishing fluid 116 flows through an opening 124c formed in the second end 124b of the dispense nozzle 124. The opening 124c has a diameter D(6) that is less than the diameter D(2) of the delivery line 126 creating a backpressure on the polishing fluid disposed in the delivery line 126. Obstructing and restricting of the fluid flow within the dispense nozzle 124 and/or delivery line 126 creates sufficient backpressure in the delivery line 126, and in fluid conduits in communication therewith, to enable detection of a change of fluid pressure in the flow splitter manifold 130 by a pressure measuring device 206 coupled thereto. In some embodiments, a controller 136 is used to monitor the pressure measured by the pressure measuring device 206. In some embodiments, the controller 136 is configured to sound an alarm and/or to stop the polishing process if the measured pressure in the flow splitter manifold 130 is outside of a determined range of the desired fluid pressure.

Figure 2A:
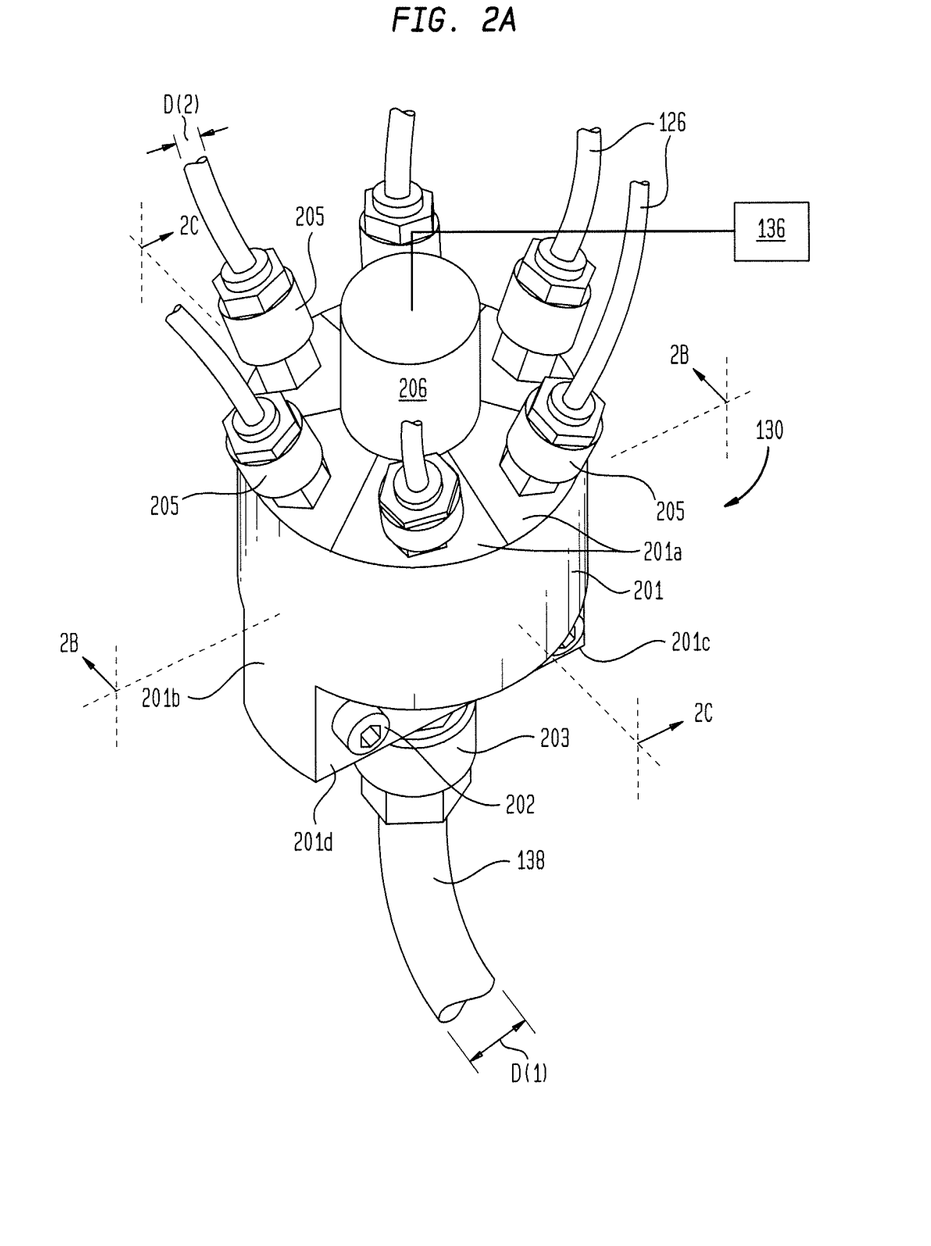
FIG. 2A is a schematic isometric view of the flow splitter manifold 130 shown in FIG. 1A.

FIG. 2A is a schematic isometric view of the flow splitter manifold 130 shown in FIG. 1A. Herein, the flow splitter manifold 130 includes a manifold body 201 having a top surface 201a, one or more side surfaces 201b, a bottom surface 201c, and one or more recessed surfaces 201d, where the one or more recessed surfaces 201d are used to secure the manifold body 201 to the support bracket 134 shown in FIG. 1 with one or more fasteners 202. The flow splitter manifold 130 further includes plurality of outlet fittings, such as a plurality of second fittings 205, each disposed in a respective second port 207 (shown in FIG. 2B) formed in the top surface 201a of the manifold body 201. Each of the plurality of second fittings 205 fluidly couple a respective delivery line 126 to a delivery conduit, such as a second conduit 211 (shown in FIG. 2B) formed in the manifold body 201. Typically, each of the plurality of delivery lines 126 have an inner diameter D(2) between about 1 mm and about 10 mm, such as between about 1 mm and about 5 mm, for example about 3 mm and the inlet line has an inner diameter D(1) between about 5 mm and about 20 mm, such as between about 5 mm and about 15 mm, for example about 10 mm.

The pressure measuring device 206, such as a pressure gauge, is herein coupled to the manifold body 201 using a third fitting (not shown). The fittings described herein are appropriately sized to fluidly couple the respective inlet line, delivery line, or pressure measuring device to fluid conduits disposed in and/or through the manifold body 201 of the flow splitter manifold 130. Typically, the fittings described herein are formed of one or more fluorine-containing polymers (flouropolymers), such as perfluoroalkoxy (PFA), fluorinated ethylene propylene (FEP), or polytetrafluoroethylene (PTFE) commercially available as TEFLON® from DuPont, or combinations thereof. In some embodiments, the fittings described herein are selected from the LQ® High Purity Fluoropolymer series available from SMC Corporation of America of Noblesville, Ind. In some embodiments, the fittings described herein are configured to form a face to face seal with the respective fitting port to reduce and/or eliminate dead space therebetween. In some embodiments, the manifold body 201 comprises a unitary body formed of a fluorine-containing polymer.

During CMP processes, the pressure measuring device 206 and the controller 136 in communication therewith monitor the pressure of the polishing fluid 116 disposed in a plurality of fluid delivery conduits, such as a plurality of second conduits 211, through a plurality of pressure measuring conduits, such as a plurality of third conduits 213. Conduits formed in and/or through the manifold body 201 are shown in FIG. 2B.

Figure 2B:
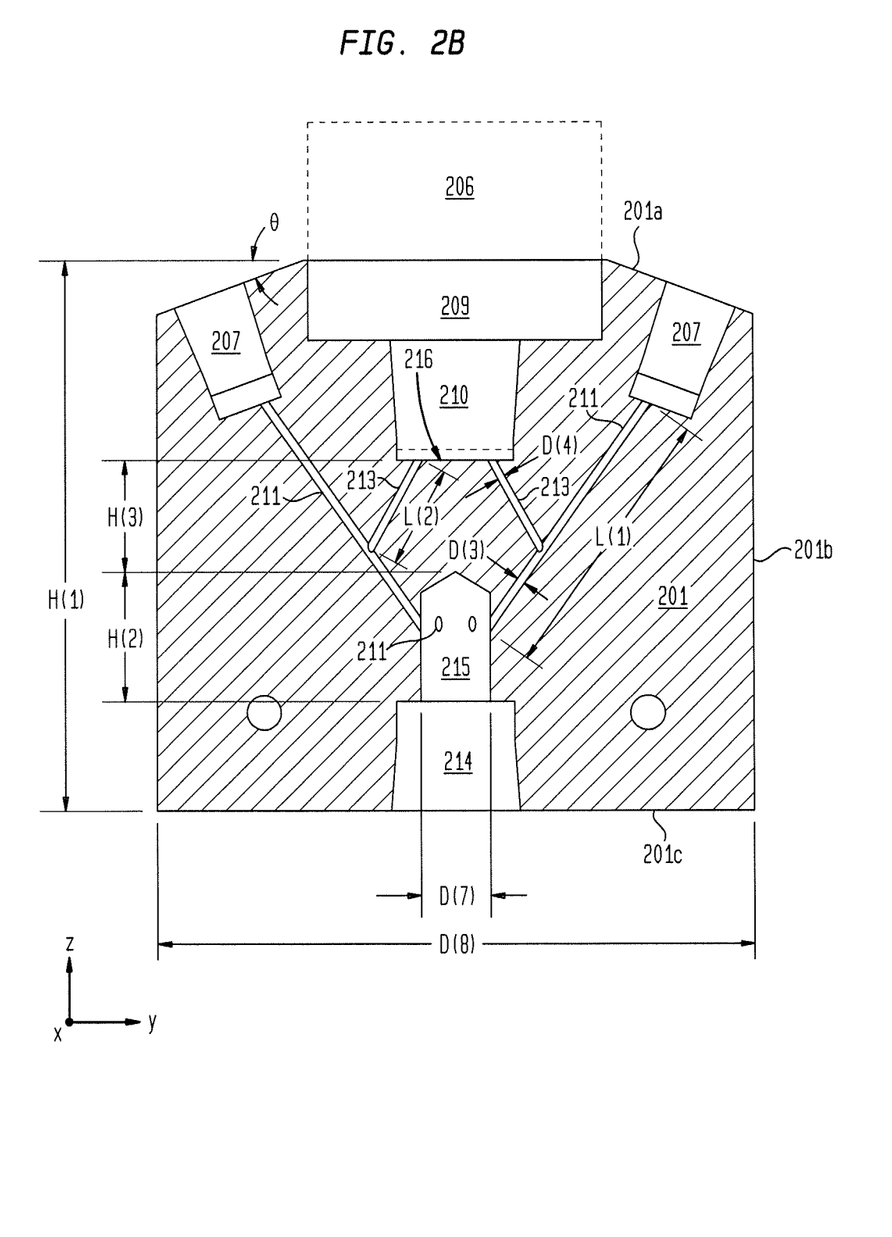
FIG. 2B is a cross-sectional view of the manifold body of the flow splitter manifold shown in FIGS. 1A and 2A taken along line 2B-2B of FIG. 2A.

FIG. 2B is a cross-sectional view of the manifold body 201 of the flow splitter manifold 130 shown in FIG. 2A taken along line 2B-2B. Typically, the manifold body 201 is formed of a polishing fluid and slurry chemical resistant polymer, such as one or more fluorine-containing polymers (fluoropolymer), such as perfluoroalkoxy (PFA), fluorinated ethylene propylene (FEP), polytetrafluoroethylene (PTFE) commercially available as TEFLON® from DuPont, or combinations thereof. Herein, the manifold body 201 is generally right cylindrically shaped and has a height H(1) between about 50 mm and about 100 mm and a diameter D(8) between 20 mm and about 80 mm. In other embodiments the manifold body 201 comprises other suitable shapes.

Herein, the manifold body 201 includes a plurality of delivery conduits extending in and/or through the material thereof. The plurality of delivery conduits includes at least a first conduit 215 and a plurality of second conduits 211. Herein, each of the plurality of second conduits 211 are disposed through the manifold body 201 and are fluidly coupled to a first conduit 215. The first conduit 215 has a height H(2) of between about 5 mm and about 20 mm, such as between 10 mm and about 15 mm and diameter D(7) of between about 5 mm and about 20 mm, such as between about 5 mm and about 15 mm, for example about 10 mm. The first conduit 215 is fluidly coupled to the inlet line 138 (shown in FIG. 2A) using an inlet fitting, such as a first fitting 203 (shown in FIG. 2A) that is disposed in a first port 214 formed in the bottom surface 201c of the manifold body 201. Each of the plurality of second conduits 211 are fluidly coupled to a respective delivery line 126 (shown in FIG. 2A) using a respective second fitting 205 (shown in FIG. 2A) disposed in one of a plurality of second ports 207 formed in the top surface 201a of the manifold body 201. Herein, each of the plurality of second conduits 211 have a length L(1) of between about 5 mm and about 50 mm, such as between about 20 mm and about 50 mm, such as between about 30 mm and about 40 mm and diameter D(3) between about 0.5 mm and about 5 mm, such as between about 0.5 mm and about 2.5 mm, for example about 1 mm. Herein, the diameter D(7) of the first conduit 215 is more than the inner diameter D(2) of the to be coupled inlet line 138. In other embodiments, the diameter D(7) of the first conduit 215 is about the same or less than the inner diameter D(7) of the to be coupled inlet line 138.

The manifold body 201 further includes one or more pressure measuring conduits, such as the plurality of third conduits 213, extending in the material thereof. Herein, each of the plurality of third conduits 213 intersect a respective one of the second conduits 211, and are fluidly coupled thereto, at a location between the first conduit 215 and the respective second port 207. Typically, a length L(2) of each of the third conduits 213 is between about 1 mm and about 30 mm, such as between about 1 mm and about 20 mm, such as between about 1 mm and about 10 mm and a diameter D(4) of each of the third conduits 213 is substantially the same as the diameter D(3) of the respective second conduit 211 in fluid communication therewith. In other embodiments the diameter D(4) of each of the third conduits 213 is less than or more than the diameter D(3) of a respective second conduit 211 and is between about 0.5 mm and about 5 mm, such as between about 0.5 mm and about 2.5 mm, for example about 1 mm.

Herein the plurality of third conduits 213 are in fluid communication with the third port 210 and the pressure measuring device 206 (shown in FIG. 2A) coupled thereto and are fluidly coupled to the pressure measuring device 206 by an appropriately sized third fitting (not shown). In some embodiments, the third port 210 and the third fitting disposed therein define a fluid reservoir 216. Herein, a material forming the manifold body 201 in a region between the first conduit 215 and the third port 210 has a thickness H(3) between about 0.5 mm and about 20 mm, such as between about 0.5 mm and about 5 mm, or for example a thickness necessary to ensure that the first conduit 215 is not in direct fluid communication with the third port 210 or the fluid reservoir 216 thereof. Fluidly coupling the pressure measuring device 206 and/or the fluid reservoir 216 to each of the plurality of second conduits 211, in contrast to a system where the pressure measuring device 206 and/or the fluid reservoir 216 is in direct fluid communication with the first conduit 215, dampens undesirable fluctuation of pressure measurements associated with inherent vibrations of the polishing system 100 during CMP processing.

In some embodiments, each of a plurality of pressure measuring devices are fluidly coupled to a respective second conduit 211 either directly or through a pressure measuring conduit disposed therebetween. In other embodiments, the third port 210 is connected to the first conduit 215 by one or more direct conduits disposed therebetween. In other embodiments, the third port 210 is in direct fluid communication with the first conduit 215. Typically, the ports 214, 207, 210 described herein are sized and/or threaded to receive the respective fittings described herein. In some embodiments, the manifold body further comprises a cavity 209 formed in the top surface 201a for receiving at least a portion of the pressure measuring device 206 which is coupled directly to the third fitting (not shown).

Figure 2C:
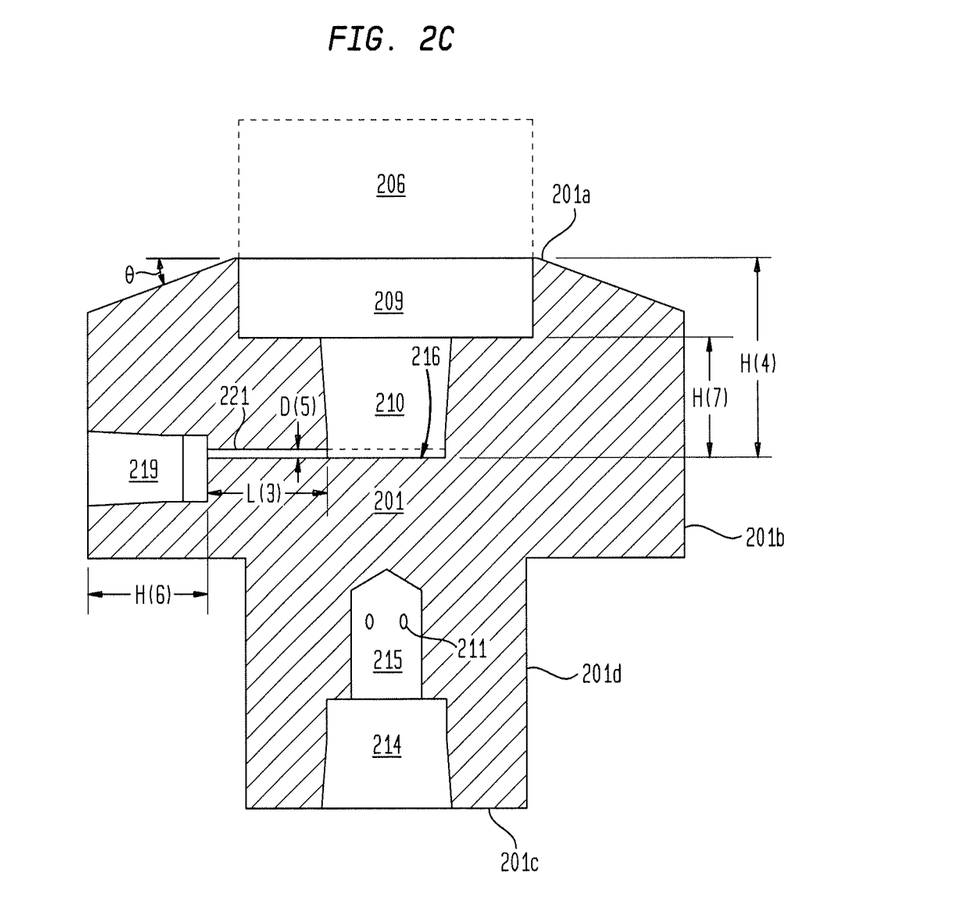
FIG. 2C is a cross-sectional view of the manifold body shown in FIGS. 1A and 2A-2B taken along line 2C-2C of FIG. 2A.

FIG. 2C is a cross-sectional view of the manifold body 201 shown in FIGS. 2A-2B taken along line 2C-2C which is orthogonal to line 2B-2B. Herein, the manifold body 201 further includes a purge conduit, such as the fourth conduit 221, fluidly coupling the third port 210 and/or the fluid reservoir 216 to a fourth port 219 formed in a side surface 201b of the manifold body 201. In some embodiments, a fitting (not shown) disposed in the fourth port 219 fluidly couples the fourth conduit 221 to a bleed line (not shown) which enables air and/or other fluids trapped in the conduits and/or ports of the manifold body 201, such as air trapped in the fluid reservoir 216, to be purged therefrom. In some embodiments, air and/or other fluids are purged from the conduits and/or ports of the manifold body 201 by opening a valve (not shown) disposed on the bleed line while simultaneously flowing the polishing fluid 116 into the manifold body 201. Once the air and/or other fluids are purged from the manifold body 201 the valve is closed and normal operation of the fluid delivery system 120 may resume. In some embodiments, the valve is coupled to a controller and the manifold body 201 is routinely purged after extended periods of non-use to remove gases accumulated therein. Herein, the fourth conduit 221 has a length L(3) of between about 5 mm and about 50 mm and a diameter D(5) between about 0.5 mm and about 5 mm, such as between about 0.5 mm and about 2.5 mm, for example about 1 mm. Desirably, the valve is located proximate to the manifold body 201 to reduce any undesirable dampening effect on pressure fluctuations in the fluid reservoir 216 associated with the volume of fluid disposed in the bleed line coupled thereto.

Figure 3:
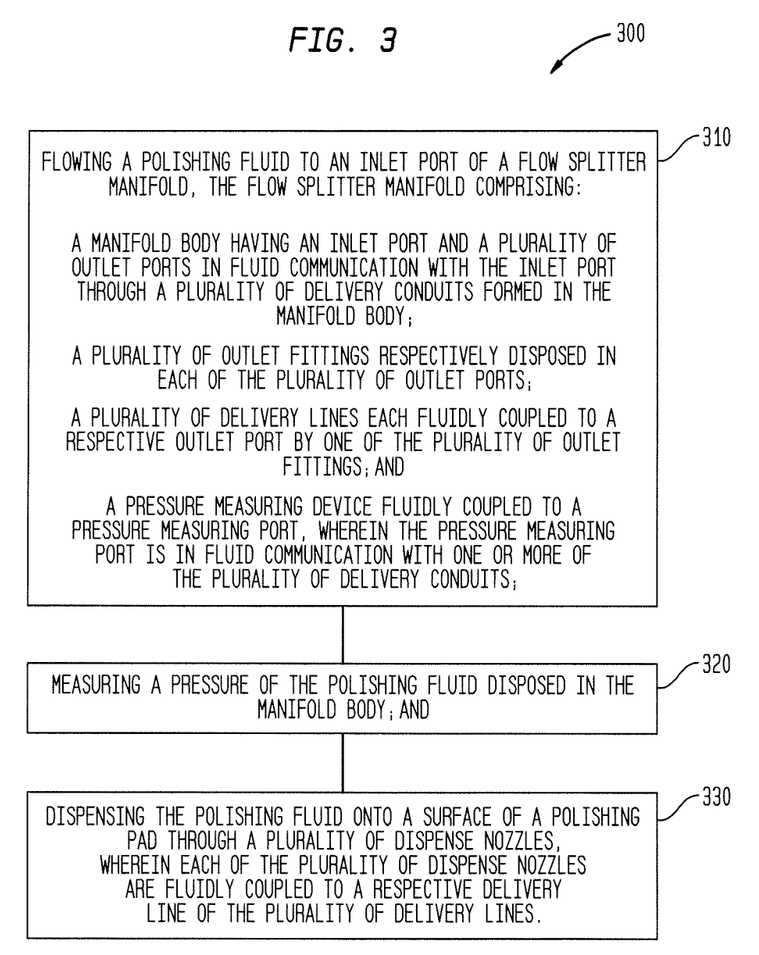
FIG. 3 is a flow diagram setting forth a method of detecting obstruction(s) and restriction(s) in a multi-dispense nozzle fluid delivery system, according to embodiments described herein.

FIG. 3 is a flow diagram illustrating a method of detecting obstruction(s) and restriction(s) in a multi-dispense nozzle fluid delivery system, according to embodiments described herein. The method 300 includes flowing a polishing fluid to an inlet port of a flow splitter manifold at activity 310. Herein, the flow splitter manifold comprises a manifold body having an inlet port and a plurality of outlet ports. Each of the plurality of outlet ports are in fluid communication with the inlet port through a plurality of delivery conduits formed in the manifold body. Herein, the flow splitter manifold further comprises a plurality of outlet fittings respectively disposed in each of the plurality of outlet ports, a plurality of delivery lines each fluidly coupled to a respective outlet port by one of the plurality of outlet fittings, and a pressure measuring device fluidly coupled to a pressure measuring port, wherein the pressure measuring port is in fluid communication with the plurality of delivery conduits. Typically, the polishing fluid comprises a polishing slurry flowed to the flow splitter manifold at a flowrate between about 50 ml/min and 1000 ml/min, such as between about 50 ml/min and 500 ml/min.

The method 300 further includes measuring the pressure of the polishing fluid disposed in the manifold body using the pressure measuring device at activity 320 and flowing the polishing fluid to a surface of a polishing pad through a plurality of dispense nozzles at activity 330, wherein each of the plurality of dispense nozzles are fluidly coupled to a respective delivery line of the plurality of delivery lines. In some embodiments, the method further includes monitoring the measured pressure using a controller coupled to and in communication with the pressure measuring device 206.

In some embodiments, the controller is configured to sound an alarm and/or to stop the polishing process if the measured pressure is outside of a determined range of the desired fluid pressure. For example, in one embodiment a fluid delivery system comprising six unobstructed dispense nozzles and delivering a combined flowrate of about 300 ml/min of polishing fluid to a polishing pad has a desired fluid pressure, measured in the flow splitter manifold as described in FIGS. 2A-2C, between about 20 Torr (above atmospheric pressure) and about 40 Torr (above atmospheric pressure), such as about 30 Torr (above atmospheric pressure). When polishing fluid flow to and/or through one of the six dispense nozzles is obstructed the pressure in the flow splitter manifold increases to between about 40 Torr (above atmospheric pressure) and about 60 Torr (above atmospheric pressure) or between about 1.5 times and about 2 times the desired fluid pressure. When polishing fluid flow to and/or through two of the six dispense nozzles is obstructed the pressure in the flow splitter manifold 130 increases to between about 60 Torr (above atmospheric pressure) and about 80 Torr (above atmospheric pressure) or between about 2 times and about 3 times the desired fluid pressure. When the polishing fluid flow to and/or through more than two of the six dispense nozzles is obstructed and/or restricted the pressure increases to more than between about 80 Torr (above atmospheric pressure) and about 100 Torr (above atmospheric pressure), or more than between about 2 times and about 5 times the desired fluid pressure.

In one embodiment, the controller is configured to sound an alarm and/or to stop the polishing process when the measured pressure indicates that the polishing fluid flowrate to and/or through two or more dispense nozzles are obstructed and/or restricted. In another embodiment, the controller is configured to sound an alarm and/or to stop the polishing process if the measure pressure indicates that the polishing fluid flowrate to and/or through more than two dispense nozzles is obstructed and/or restricted.

In some embodiments, the method 300 further includes determining the delivery line and/or nozzle that has an obstruction or restriction disposed therein. In embodiments where a single pressure measuring device is used to monitor a plurality of dispense nozzles and the delivery lines coupled thereto a user must determine which dispense nozzle(s) and/or delivery line(s) are obstructed and/or restricted. In some embodiments, the location of the obstruction and/or restriction is determined by flowing fluid through the fluid delivery system and visually observing the fluid flow from each of the plurality of dispense nozzles. Typically, once the location of a restriction or obstruction is determined, the restricted or obstructed dispense nozzle(s) and/or delivery line(s) are replaced. In some embodiments the delivery arm, including the plurality of dispense nozzles and the delivery lines coupled thereto, is replaced with a new or refurbished arm in order to reduce equipment downtime related to troubleshooting the location of the restriction or obstruction. In some of those embodiments, the removed delivery arm is later refurbished by replacing and/or cleaning the plurality of dispense nozzles and or the delivery lines coupled thereto as a preventative maintenance procedure.

The methods and apparatus provided herein enable detection of one or more obstructions or restrictions in the delivery lines and/or dispense nozzles of a multi-nozzle fluid dispense system with sufficient sensitivity to avoid false alarms triggered by unavoidable and inherent vibrations of the polishing system during CMP processing.

While the foregoing is directed to embodiments of the present disclosure, other and further embodiments of the disclosure may be devised without departing from the basic scope thereof, and the scope thereof is determined by the claims that follow.

The invention claimed is:

1. A fluid delivery apparatus, comprising:
   a fluid distribution manifold comprising a unitary manifold body having an inlet port, a plurality of first outlet ports, a pressure measuring port, a first fluid delivery conduit, a plurality of second fluid delivery conduits, and a plurality of pressure measuring conduits formed therein; and
   a plurality of first outlet fittings respectively disposed in each of the plurality of first outlet ports, wherein
   each of the plurality of first outlet fittings respectively form a face to face seal with each of the plurality of first outlet ports, and
   each of the plurality of first outlet fittings are configured to fluidly connect the plurality of second fluid delivery conduits to a corresponding delivery line of a plurality of delivery lines,
   the plurality of second fluid delivery conduits connect the first fluid delivery conduit to corresponding ones of the plurality of first outlet ports so that the inlet port is in fluid communication with each of the plurality of first outlet ports through the first fluid delivery conduit and the plurality of second fluid delivery conduits, and
   the plurality of pressure measuring conduits connect the pressure measuring port to corresponding ones of the plurality of second fluid delivery conduits.

2. The fluid delivery apparatus of claim 1, comprising from about 2 to about 20 second fluid delivery conduits.

3. The fluid delivery apparatus of claim 1, wherein the unitary manifold body is formed of a fluoropolymer.

4. The fluid delivery apparatus of claim 1, further comprising a pressure measuring device fluidly coupled to the pressure measuring port.

5. The fluid delivery apparatus of claim 4, wherein the plurality of pressure measuring conduits are in direct fluid communication with a fluid reservoir disposed between the pressure measuring device and the plurality of pressure measuring conduits.

6. The fluid delivery apparatus of claim 5, further comprising a second outlet fitting disposed in a second outlet port of the unitary manifold body, wherein a bleed conduit fluidly couples the fluid reservoir to the second outlet port, and the second outlet fitting is configured to fluidly connect the bleed conduit to a bleed line.

7. The fluid delivery apparatus of claim 1, wherein each of the plurality of second fluid delivery conduits has a diameter between about 0.5 mm and about 5 mm.

8. The fluid delivery apparatus of claim 1, wherein each of the plurality of first outlet fittings are configured to fluidly couple the plurality of second fluid delivery conduits to a corresponding delivery line of a plurality of delivery lines, and one or more of the plurality of delivery lines having a larger diameter than the corresponding ones of the plurality of second fluid delivery conduits fluidly coupled thereto.

9. The fluid delivery apparatus of claim 1, further comprising the plurality of delivery lines respectively fluidly coupled to corresponding ones of the plurality of second fluid delivery conduits.

10. The fluid delivery apparatus of claim 9, further comprising a plurality of dispense nozzles respectively coupled to each of the plurality of delivery lines.

11. The fluid delivery apparatus of claim 1, wherein each of the plurality of pressure measuring conduits intersect a respective one of the plurality of second fluid delivery conduits between the first fluid delivery conduit and a respective one of the plurality of first outlet ports.

12. The fluid delivery apparatus of claim 11, wherein each of the plurality of pressure measuring conduits has a diameter between about 0.5 mm and about 5 mm.

13. The fluid delivery apparatus of claim 1, wherein the fluid distribution manifold is configured to be fixedly mounted to a polishing system at a location below a horizontal plane of a delivery arm, the delivery arm having a plurality of dispense nozzles disposed therein.

14. The fluid delivery apparatus of claim 1, wherein the pressure measuring port is in direct fluid communication with the plurality of pressure measuring conduits.

15. A fluid delivery apparatus, comprising:
    a fluid distribution manifold comprising a unitary manifold body having an inlet port and a plurality of outlet ports in fluid communication with the inlet port through a plurality of fluid delivery conduits, the plurality of fluid delivery conduits comprising a first conduit and a plurality of second conduits fluidly connected to the first conduit;
    a pressure measuring port;
    a plurality of outlet fittings respectively disposed in each of the plurality of outlet ports, wherein
    each of the plurality of outlet fittings respectively form a face to face seal with each of the plurality of outlet ports, and
    each of the plurality of outlet fittings are configured to fluidly connect a respective one of the plurality of second conduits to a delivery line; and
    a pressure measuring device fluidly coupled to the pressure measuring port.

16. The fluid delivery apparatus of claim 15, wherein the unitary manifold body is formed of a fluoropolymer.

17. The fluid delivery apparatus of claim 15, further comprising a plurality of delivery lines each respectively fluidly coupled to the plurality of second conduits.

18. The fluid delivery apparatus of claim 17, further comprising a plurality of dispense nozzles each respectively coupled to the plurality of delivery lines.

19. A method of detecting obstruction or restriction in a multi-dispense nozzle fluid delivery system, comprising:

flowing a polishing fluid to an inlet port of a fluid delivery apparatus, comprising:

a fluid distribution manifold comprising a unitary manifold body having the inlet port and a plurality of outlet ports in fluid communication with the inlet port through a plurality of fluid delivery conduits, the plurality of fluid delivery conduits comprising a first conduit and a plurality of second conduits fluidly connected to the first conduit;

a pressure measuring port connected to each of the plurality of second conduits;

a plurality of outlet fittings disposed in each of the plurality of outlet ports, wherein each of the plurality of outlet fittings respectively form a face to face seal with each of the plurality of outlet ports, each of the plurality of outlet fittings connects a respective one of the plurality of second conduits to a delivery line of a plurality of delivery lines; and a pressure measuring device fluidly coupled to the pressure measuring port;

determining, by use of the pressure measuring device, a pressure of the polishing fluid disposed in the plurality of second conduits; and dispensing the polishing fluid onto a surface of a polishing pad through a plurality of dispense nozzles, wherein each of the plurality of dispense nozzles are fluidly coupled to the fluid distribution manifold through respective delivery lines of the plurality of delivery lines.

20. The method of claim 19, wherein the manifold body is fixedly mounted to a polishing system and is disposed below a horizontal plane of a delivery arm having the plurality of dispense nozzles disposed therein.

21. The method of claim 19, further comprising:

communicating the measured pressure of the polishing fluid disposed in the second conduits to a system controller of a polishing system;

determining, by use of the system controller, a change in the measured pressure; and initiating, by use of the system controller, a change in a polishing process and/or alerting a user based on the determined change in the measured pressure.

22. The method of claim 21, wherein the change in the measured pressure corresponds to an obstruction in one or more of the plurality of delivery lines, one or more of the plurality of dispense nozzles, or both.

* * * * *